(12) United States Patent
Curtis et al.

(10) Patent No.: US 7,050,916 B2
(45) Date of Patent: May 23, 2006

(54) METHOD FOR POWER QUALITY SUMMARY AND TRENDING

(75) Inventors: Larry E. Curtis, Murfreesboro, TN (US); Jon A. Bickel, Murfreesboro, TN (US)

(73) Assignee: Square D Company, Palatine, IL (US)

( * ) Notice: Subject to any disclaimer, the term of this patent is extended or adjusted under 35 U.S.C. 154(b) by 0 days.

(21) Appl. No.: 10/702,146

(22) Filed: Nov. 5, 2003

(65) Prior Publication Data
US 2005/0114057 A1    May 26, 2005

(51) Int. Cl.
*G01N 37/00*    (2006.01)
*G06F 19/00*    (2006.01)
(52) U.S. Cl. ...................................... 702/81
(58) Field of Classification Search ............... 702/60, 702/61, 62, 64, 65, 81
See application file for complete search history.

(56) References Cited

U.S. PATENT DOCUMENTS

| | | | |
|---|---|---|---|
| 5,625,751 A * | 4/1997 | Brandwajn et al. ......... 706/20 |
| 5,737,209 A * | 4/1998 | Stevens ..................... 363/143 |
| 6,549,880 B1 * | 4/2003 | Willoughby et al. ......... 703/13 |
| 6,577,961 B1 * | 6/2003 | Hubbard et al. ............ 702/60 |
| 6,611,773 B1 * | 8/2003 | Przydatek et al. .......... 702/62 |
| 2003/0014200 A1 * | 1/2003 | Jonker et al. ............... 702/60 |
| 2003/0135339 A1 * | 7/2003 | Gristina et al. ............. 702/61 |

OTHER PUBLICATIONS

Bradley, D., "Applying Predictive Maintenance to Power Quality", Oct. 14-18, 2001, Telecommunications Energy Conference, 2001. INTELEC 2001. Twenty-Third International□□pp. 229-237.*

Chung et al., "Development of Power Quality Diagnosis System for Quality Improvement", Jul. 13-17, 2003, Power Engineering Society General Meeting, 2003, IEEE. , pp. 1262 vol. 2□□.*

* cited by examiner

*Primary Examiner*—John Barlow
*Assistant Examiner*—Demetrius Pretlow

(57) ABSTRACT

A system for accumulating and evaluating electromagnetic phenomena of at least one power quality category of a power distribution system, using a circuit monitor or processing system that summarizes and trends electromagnetic phenomena. The system provides for expressing the power quality index as a single number for each power quality category present and for combining multiple power quality indices into a single overall power quality index.

16 Claims, 13 Drawing Sheets

| | |
|---|---|
| 1 | AIRCRAFT HANGER |
| 2 | CONTROL TOWER |
| 3 | TERMINAL |
| 4 | EMERGENCY RESPONSE |
| 5 | BAGGAGE HANDLING |
| 6 | AMUSEMENT RIDE |
| 7 | OFFICE BUILDING |
| 8 | RESTAURANT |
| 9 | RETAIL |
| 10 | CLASSROOM |
| 11 | DORMITORY |
| 12 | LIBRARY |
| 13 | DATA PROCESSING |
| 14 | BARRACKS |
| 15 | HOSPITAL |
| 16 | SEMICONDUCTOR FAB BLDG |
| 17 | WASTE WATER TREATMENT PLANT |
| 18 | AUTOMOTIVE MANUFACTURING |
| 19 | FOOD/BEVERAGE PROCESSING |
| 20 | PLASTIC EXTRUSION |
| 21 | CEMENT/GLASS/STONE |
| 22 | SMELTING |
| 23 | PAPER/WOOD/PULP |
| 24 | PETROCHEMICAL PROCESSING |
| 25 | PHARMACEUTICAL MANUFACTURING |
| 26 | PRINTING AND PUBLISHING |
| 27 | ARENA |
| 28 | CASINO |
| 29 | RUBBER/PLASTICS PROCESSING |
| 30 | METAL MINING |
| 31 | TEXTILE MANUFACTURING |
| 32 | OIL DRILLING |
| 33 | GYMNASIUM |
| 34 | UTILITIES/CENTRAL PLANT |
| 35 | SHIPPING |
| 36 | WAREHOUSE |
| 37 | FURNITURE MANUFACTURING |
| 38 | WATER TREATMENT |
| 39 | PARKING GARAGE |
| 40 | DAIRY |
| 41 | GIN |
| 42 | BULK MAIL PROCESSING |
| 43 | ELECTRONIC MANUFACTURING |
| 44 | RAILROAD SYSTEMS |
| 45 | WATER/SEWAGE PUMPING STATION |
| 46 | OIL WELL |
| 47 | AGRICULTURAL PROCESSING |
| 48 | METAL FOUNDRY |
| 49 | COAL MINE |
| 50 | SLAUGHTERHOUSE |
| 51 | VETERINARY MEDICINE |
| 52 | WATER DRILLING |
| 53 | BAKERY |
| 54 | MACHINE SHOP |
| 55 | COMMUNICATIONS |
| 56 | AEROSPACE MANUFACTURING |
| 57 | PUBLIC TRANSPORTATION |
| 58 | DOCK SHIPPING SHORE POWER |
| 59 | BANKING SERVICES |
| 60 | HOTEL |
| 61 | THEATRE |
| 62 | NURSING HOME |
| 63 | LABORATORY |
| 64 | ZOO |
| 65 | CHURCH |
| 66 | COURTHOUSE |
| 67 | CORRECTIONAL INSTITUTION |
| 68 | AEROSPACE CONTROL |

*Fig. 3*
BUILDING TYPES

*Fig. 4*
LOAD TYPES PRESENT
LIBRARY (EXCERPT)

| BUILDING TYPE | MOTORS, POLYPHASE, INDUCTION | MOTORS, POLYPHASE, SYNCHRONOUS | MOTORS, DC GEAR | MOTORS, DC BRUSHLESS | MOTORS, DC SERVO | ASD, DC | ASD, AC PWM | ASD, AC CSI | ASD, AC VSI | LIGHTING, FLUORESCENT | LIGHTING, INCANDESCENT | LIGHTING, HP SODIUM | LIGHTING, LP SODIUM | LIGHTING, MERCURY VAPOR | LIGHTING, METAL HALIDE | LIGHTING, TUNGSTEN HALOGEN |
|---|---|---|---|---|---|---|---|---|---|---|---|---|---|---|---|---|
| AIRCRAFT HANGER | 1 | 1 | 1 | 1 | 1 | 0 | 0 | 0 | 0 | 1 | 1 | 1 | 1 | 1 | 1 | 1 |
| CONTROL TOWER | 1 | 1 | 1 | 1 | 1 | 1 | 1 | 1 | 1 | 1 | 1 | 1 | 1 | 1 | 1 | 1 |
| TERMINAL | 0 | 0 | 0 | 0 | 0 | 0 | 0 | 0 | 0 | 1 | 1 | 1 | 1 | 1 | 1 | 1 |
| EMERGENCY RESPONSE | 1 | 1 | 1 | 1 | 1 | 1 | 1 | 1 | 1 | 1 | 1 | 1 | 1 | 1 | 1 | 1 |
| BAGGAGE HANDLING | 1 | 1 | 1 | 1 | 1 | 1 | 1 | 1 | 1 | 1 | 1 | 0 | 0 | 0 | 0 | 0 |
| AMUSEMENT RIDE | 1 | 1 | 0 | 0 | 0 | 1 | 1 | 1 | 1 | 1 | 1 | 1 | 1 | 1 | 1 | 1 |
| OFFICE BUILDING | 0 | 0 | 0 | 0 | 0 | 0 | 0 | 0 | 0 | 1 | 1 | 0 | 0 | 0 | 0 | 0 |
| RESTAURANT | 0 | 0 | 0 | 0 | 0 | 0 | 0 | 0 | 0 | 1 | 1 | 0 | 0 | 0 | 0 | 0 |
| RETAIL | 0 | 0 | 0 | 0 | 0 | 0 | 0 | 0 | 0 | 1 | 1 | 0 | 0 | 0 | 0 | 0 |
| CLASSROOM | 0 | 0 | 0 | 0 | 0 | 0 | 0 | 0 | 0 | 1 | 1 | 0 | 0 | 0 | 0 | 0 |
| DORMITORY | 0 | 0 | 0 | 0 | 0 | 0 | 0 | 0 | 0 | 1 | 1 | 0 | 0 | 0 | 0 | 0 |

| BUILDING TYPE | INTERRUPTION WEIGHTING LIBRARY | DAILY | | WEEKLY | | MONTHLY | |
|---|---|---|---|---|---|---|---|
| | | SHORT-TERM INTERRUPTION (< 3 MIN) | LONG-TERM INTERRUPTION (>= 3 MIN) | SHORT-TERM INTERRUPTION (< 3 MIN) | LONG-TERM INTERRUPTION (>= 3 MIN) | SHORT-TERM INTERRUPTION (< 3 MIN) | LONG-TERM INTERRUPTION (>= 3 MIN) |
| DEFAULT | 0 | 1 | 1 | 2 | 2 | 3 | 3 |
| AIRCRAFT HANGER | 1 | 1 | 1 | 2 | 2 | 3 | 3 |
| CONTROL TOWER | 2 | 1 | 1 | 1 | 1 | 1 | 1 |
| TERMINAL | 3 | 1 | 1 | 2 | 2 | 3 | 3 |
| EMERGENCY RESPONSE | 4 | 1 | 1 | 2 | 2 | 3 | 3 |
| BAGGAGE HANDLING | 5 | 1 | 1 | 2 | 2 | 3 | 3 |
| AMUSEMENT RIDE | 6 | 1 | 1 | 2 | 2 | 3 | 3 |
| OFFICE BUILDING | 7 | 1 | 1 | 2 | 2 | 3 | 3 |
| RESTAURANT | 8 | 1 | 1 | 2 | 2 | 3 | 3 |
| RETAIL | 9 | 1 | 1 | 2 | 2 | 3 | 3 |
| CLASSROOM | 10 | 1 | 1 | 2 | 2 | 3 | 3 |
| DORMITORY | 11 | 1 | 1 | 2 | 2 | 3 | 3 |

*Fig. 5*

INTERRUPTIONS WEIGHTING
LIBRARY (EXCERPT)

| LOAD TYPE | CATEGORY WEIGHTS LIBRARY | UNDERVOLTAGE | OVERVOLTAGE | VOLTAGE UNBALANCE | WAVEFORM DISTORTION | FREQUENCY DEIVATION | INTERRUPTIONS | VOLTAGE SAGS | VOLTAGE SWELLS | FLICKER | TRANSIENT OVERVOLTAGES |
|---|---|---|---|---|---|---|---|---|---|---|---|
| DEFAULT | 0 | 10 | 9 | 4 | 8 | 4 | 10 | 10 | 8 | 4 | 8 |
| AC MOTORS | 1 | 10 | 10 | 10 | 7 | 3 | 10 | 10 | 7 | 2 | 8 |
| DC MOTORS | 2 | 10 | 10 | 10 | 7 | 3 | 10 | 10 | 7 | 2 | 8 |
| ASDS | 3 | 10 | 10 | 8 | 10 | 3 | 10 | 10 | 8 | 3 | 8 |
| LIGHTING 1 (INC., FLUOR.) | 4 | 7 | 8 | 0 | 5 | 3 | 10 | 10 | 6 | 8 | 5 |
| LIGHTING 2 (HID) | 5 | 9 | 8 | 0 | 5 | 5 | 10 | 10 | 6 | 7 | 5 |
| COMPUTERS | 6 | 10 | 9 | 0 | 8 | 3 | 10 | 10 | 9 | 2 | 8 |
| MEDICAL IMAGING EQUIPMENT | 7 | 10 | 9 | 0 | 8 | 3 | 10 | 10 | 9 | 2 | 8 |
| SEMICONDUCTOR MFG. EQUIPMENT | 8 | 10 | 9 | 0 | 8 | 3 | 10 | 10 | 9 | 2 | 8 |
| CNC MACHINE TOOLS | 9 | 10 | 9 | 0 | 8 | 3 | 10 | 10 | 9 | 2 | 8 |
| OFFICE EQUIPMENT | 10 | 10 | 9 | 0 | 8 | 3 | 10 | 10 | 9 | 2 | 8 |
| ARC FURNACES | 11 | 9 | 9 | 5 | 10 | 3 | 10 | 10 | 8 | 8 | 5 |
| CAPACITORS | 12 | 10 | 10 | 8 | 10 | 3 | 3 | 5 | 5 | 5 | 5 |
| TRANSFORMERS | 13 | 10 | 10 | 10 | 8 | 3 | 0 | 0 | 0 | 5 | 8 |
| REACTORS | 14 | 8 | 8 | 8 | 0 | 0 | 0 | 8 | 8 | 0 | 0 |

*Fig. 6*
CATEGORY WEIGHTS
LIBRARY

| LOAD TYPE | ALARM SETPOINT LIBRARY | UNDERVOLTAGE LEVEL 1 | UNDERVOLTAGE LEVEL 2 | OVERVOLTAGE LEVEL 1 | OVERVOLTAGE LEVEL 2 | VOLTAGE UNBALANCE LEVEL 1 | VOLTAGE UNBALANCE LEVEL 2 | OVER THD LEVEL 1 | OVER THD LEVEL 2 | OVER WORST HARMONIC LEVEL 1 | OVER WORST HARMONIC LEVEL 2 | OVER FREQUENCY LEVEL 1 | OVER FREQUENCY LEVEL 2 | UNDER FREQUENCY LEVEL 1 | UNDER FREQUENCY LEVEL 2 | OVER FLICKER LEVEL 1 | OVER FLICKER LEVEL 2 |
|---|---|---|---|---|---|---|---|---|---|---|---|---|---|---|---|---|---|
| DEFAULT | 0 | 9500 | 9000 | 10500 | 11000 | 150 | 200 | 400 | 500 | 250 | 300 | 10050 | 10083 | 9950 | 9917 | 50 | 100 |
| MOTORS, POLYPHASE, INDUCTION | 1 | | 9000 | 10500 | 11000 | 150 | 200 | 400 | 500 | 250 | 300 | 10050 | 10083 | 9950 | 9917 | 50 | 100 |
| MOTORS, DC GEAR | 2 | 9500 | 9000 | 10500 | 11000 | 150 | 200 | 400 | 500 | 250 | 300 | 10050 | 10083 | 9950 | 9917 | 50 | 100 |
| ASD, DC | 3 | 9500 | 9000 | 10500 | 11000 | 150 | 200 | 400 | 500 | 250 | 300 | 10050 | 10083 | 9950 | 9917 | 50 | 100 |
| LIGHTING, FLOURESCENT | 4 | 9500 | 9000 | 10500 | 11000 | 150 | 200 | 400 | 500 | 250 | 300 | 10050 | 10083 | 9950 | 9917 | 50 | 100 |
| LIGHTING, HP SODIUM | 5 | 9500 | 9000 | 10500 | 11000 | 150 | 200 | 400 | 500 | 250 | 300 | 10050 | 10083 | 9950 | 9917 | 50 | 100 |
| COMPUTERS | 6 | 9500 | 9000 | 10500 | 11000 | 150 | 200 | 400 | 500 | 250 | 300 | 10050 | 10083 | 9950 | 9917 | 50 | 100 |
| MEDICAL IMAGING EQUIPMENT | 7 | 9500 | 9000 | 10500 | | 200 | 200 | 400 | 500 | 250 | 300 | 10050 | 10083 | 9950 | 9917 | 50 | 100 |
| SEMICONDUCTOR MANUFACTURING EQUIPMENT | 8 | 9500 | 9000 | 10500 | 11000 | 150 | 200 | 400 | 500 | 250 | 300 | 10050 | 10083 | 9950 | 9917 | 50 | 100 |

*Fig. 7*
ALARM SETPOINTS LIBRARY

| | | | | | | | | | | | | | |
|---|---|---|---|---|---|---|---|---|---|---|---|---|---|
| CNC MACHINE TOOLS | 9 | 9500 | 9000 | 10500 | 11000 | 150 | 200 | 400 | 500 | 250 | 300 | 10050 | 10083 | 9950 | 9917 | 50 | 100 |
| OFFICE EQUIPMENT (COPIERS, PRINTERS) | 10 | | | | | | | | | | | | | | | | |
| ARC FURNACE | 11 | 9500 | 9000 | 10500 | 11000 | 150 | 200 | 400 | 500 | 250 | 300 | 10050 | 10083 | 9950 | 9917 | 50 | 100 |
| CAPACITORS | 12 | 9500 | 9000 | 10500 | 11000 | 150 | 200 | 400 | 500 | 250 | 300 | 10050 | 10083 | 9950 | 9917 | 50 | 100 |
| TRANSFORMERS | 13 | 9500 | 9000 | 10500 | 11000 | 150 | 200 | 400 | 500 | 250 | 300 | 10050 | 10083 | 9950 | 9917 | 50 | 100 |
| REACTOR | 14 | 9500 | 9000 | 10500 | 11000 | 150 | 200 | 400 | 500 | 250 | 300 | 10050 | 10083 | 9950 | 9917 | 50 | 100 |

*Fig. 7-1*

ALARM SETPOINTS LIBRARY

| LOAD TYPE | ALARM WEIGHTING LIBRARY | UNDERVOLTAGE LEVEL 1 | UNDERVOLTAGE LEVEL 2 | OVERVOLTAGE LEVEL 1 | OVERVOLTAGE LEVEL 2 | VOLTAGE UNBALANCE LEVEL 1 | VOLTAGE UNBALANCE LEVEL 2 | OVER THD LEVEL 1 | OVER THD LEVEL 2 | OVER WORST HARMONIC LEVEL 1 | OVER WORST HARMONIC LEVEL 2 | OVER FREQUENCY LEVEL 1 | OVER FREQUENCY LEVEL 2 | UNDER FREQUENCY LEVEL 1 | UNDER FREQUENCY LEVEL 2 | OVER FLICKER LEVEL 1 | OVER FLICKER LEVEL 2 |
|---|---|---|---|---|---|---|---|---|---|---|---|---|---|---|---|---|---|
| DEFAULT | 0 | | | | | | | | | | | | | | | | |
| MOTORS, POLYPHASE, INDUCTION | 1 | 240 | 120 | 240 | 120 | 600 | 100 | 600 | 10 | 600 | 10 | 120 | 30 | 120 | 30 | 800 | 60 |
| MOTORS, DC GEAR | 2 | 240 | 120 | 240 | 120 | 600 | 100 | 600 | 10 | 600 | 10 | 120 | 30 | 120 | 30 | 800 | 60 |
| ASD, DC | 3 | 240 | 120 | 240 | 120 | 600 | 100 | 600 | 10 | 600 | 10 | 120 | 30 | 120 | 30 | 800 | 60 |
| LIGHTING, FLOURESCENT | 4 | 240 | 120 | 240 | 120 | 600 | 100 | 600 | 10 | 600 | 10 | 120 | 30 | 120 | 30 | 800 | 60 |
| LIGHTING, HP SODIUM | 5 | 240 | 120 | 240 | 120 | 600 | 100 | 600 | 10 | 600 | 10 | 120 | 30 | 120 | 30 | 800 | 60 |
| COMPUTERS | 6 | 240 | 120 | 240 | 120 | 600 | 100 | 600 | 10 | 600 | 10 | 120 | 30 | 120 | 30 | 800 | 60 |
| MEDICAL IMAGING EQUIPMENT | 7 | 240 | 120 | 240 | 120 | 600 | 100 | 600 | 10 | 600 | 10 | 120 | 30 | 120 | 30 | 800 | 60 |
| SEMICONDUCTOR MANUFACTURING EQUIPMENT | 8 | 240 | 120 | 240 | 120 | 600 | 100 | 600 | 10 | 600 | 10 | 120 | 30 | 120 | 30 | 800 | 60 |
| CNC MACHINE TOOLS | 9 | 240 | 120 | 240 | 120 | 600 | 100 | 600 | 10 | 600 | 10 | 120 | 30 | 120 | 30 | 800 | 60 |
| OFFICE EQUIPMENT (COPIERS, PRINTERS) | 10 | 240 | 120 | 240 | 120 | 600 | 100 | 600 | 10 | 600 | 10 | 120 | 30 | 120 | 30 | 800 | 60 |
| ARC FURNACE | 11 | 240 | 120 | 240 | 120 | 600 | 100 | 600 | 10 | 600 | 10 | 120 | 30 | 120 | 30 | 800 | 60 |
| CAPACITORS | 12 | 240 | 120 | 240 | 120 | 600 | 100 | 600 | 10 | 600 | 10 | 120 | 30 | 120 | 30 | 800 | 60 |
| TRANSFORMERS | 13 | 240 | 120 | 240 | 120 | 600 | 100 | 600 | 10 | 600 | 10 | 120 | 30 | 120 | 30 | 800 | 60 |
| REACTOR | 14 | 240 | 120 | 240 | 120 | 600 | 100 | 600 | 10 | 600 | 10 | 120 | 30 | 120 | 30 | 800 | 60 |

*Fig. 8*
ALARM WEIGHTS LIBRARY

| | DURATION (T) SECONDS | | | | | | | | | | |
|---|---|---|---|---|---|---|---|---|---|---|---|
| DEPTH (D) % NOMINAL | 0.01<= t < 0.02 | 0.02<= t <0.05 | 0.05<= t <0.1 | 0.1<= t <0.2 | 0.2<= t <0.5 | 0.5<= t <1 | 1<= t <3 | 3<= t <10 | 10<= t <20 | 20<= t <60 | 60<= t <180 |
| 10 <= D < 20 | OK | OK | OK | OK | OK | OK | OK | OK | 1 | 1 | 1 |
| 20 <= D < 30 | OK | OK | OK | OK | OK | 1 | 1 | 1 | 1 | 1 | 1 |
| 30 <= D < 40 | OK | 1 | 1 | 1 | 1 | 1 | 1 | 1 | 1 | 1 | 1 |
| 40 <= D < 50 | OK | 1 | 1 | 1 | 1 | 1 | 1 | 1 | 1 | 1 | 1 |
| 50 <= D < 60 | OK | 1 | 1 | 1 | 1 | 1 | 1 | 1 | 1 | 1 | 1 |
| 60 <= D < 80 | OK | 1 | 1 | 1 | 1 | 1 | 1 | 1 | 1 | 1 | 1 |
| 80 <= D < 99 | OK | 1 | 1 | 1 | 1 | 1 | 1 | 1 | 1 | 1 | 1 |

*Fig. 9*
VOLTAGE SAGS WEIGHTING
LIBRARY (EXCERPT)

| MAGNITUDE (M) % NOMINAL | 0.01<= t < 0.02 | 0.02<= t <0.05 | 0.05<= t <0.1 | 0.1<= t <0.2 | 0.2<= t <0.5 | 0.5<= t <1 | 1<= t <3 | 3<= t <10 | 10<= t <20 | 20<= t <60 | 60<= t <180 |
|---|---|---|---|---|---|---|---|---|---|---|---|
| 110 < M <= 120 | OK | OK | OK | OK | OK | 1 | 1 | 1 | 1 | 1 | 1 |
| 120 < M <= 130 | 1 | 1 | 1 | 1 | 1 | 1 | 1 | 1 | 1 | 1 | 1 |
| 130 < M <= 140 | 1 | 1 | 1 | 1 | 1 | 1 | 1 | 1 | 1 | 1 | 1 |
| 140 < M <= 150 | 1 | 1 | 1 | 1 | 1 | 1 | 1 | 1 | 1 | 1 | 1 |
| 150 < M <= 170 | 1 | 1 | 1 | 1 | 1 | 1 | 1 | 1 | 1 | 1 | 1 |
| 170 < M <= 200 | 1 | 1 | 1 | 1 | 1 | 1 | 1 | 1 | 1 | 1 | 1 |
| M > 200 | 1 | 1 | 1 | 1 | 1 | 1 | 1 | 1 | 1 | 1 | 1 |

*Fig. 10*
VOLTAGE SWELLS WEIGHTING
LIBRARY (EXCERPT)

| DAILY MAGNITUDE (M) % NOMINAL | DURATION (t) MICROSECONDS | | | | | | |
|---|---|---|---|---|---|---|---|
| | t < 20 | 20 <= t < 50 | 50 <= t < 100 | 100 <= t < 200 | 200 <= t < 500 | 500 <= t < 1000 | 1000 <= t < 2000 |
| 200 < M <= 300 | 4 | 4 | 4 | 4 | 4 | 2 | 2 |
| 300 < M <= 400 | 4 | 4 | 4 | 4 | 2 | 2 | 2 |
| 400 < M <= 500 | 4 | 4 | 4 | 2 | 2 | 2 | 2 |
| 500 < M <= 600 | 4 | 4 | 3 | 2 | 2 | 2 | 2 |
| 600 < M <= 700 | 4 | 3 | 3 | 2 | 2 | 2 | 2 |
| 700 < M <= 800 | 4 | 3 | 3 | 2 | 2 | 2 | 2 |
| 800 < M <= 900 | 3 | 3 | 3 | 2 | 2 | 2 | 2 |
| 900 < M <= 1000 | 3 | 3 | 3 | 2 | 2 | 2 | 2 |
| M > 1000 | 3 | 3 | 3 | 2 | 2 | 2 | 2 |

*Fig. 11*
TRANSIENT OVERVOLTAGE
WEIGHTING LIBRARY (EXCERPT)

DISPLAY OF OVERALL POWER QUALITY INDEX SUMMARY

| | THIS WEEK | LAST WEEK | 30 DAY TREND | THIS MONTH | LAST MONTH | 52 WEEK TREND |
|---|---|---|---|---|---|---|
| OVERALL | GOOD | FAIR | BETTER | GOOD | FAIR | BETTER |
| UNDER VOLTAGE | GOOD | GOOD | STEADY | GOOD | GOOD | STEADY |
| OVER VOLTAGE | GOOD | GOOD | STEADY | GOOD | GOOD | STEADY |
| VOLTAGE IMBALANCE | FAIR | GOOD | WORSE | FAIR | GOOD | WORSE |
| WAVEFORM DISTORTION | POOR | GOOD | MUCH WORSE | POOR | GOOD | MUCH WORSE |
| FREQUENCY VARIATIONS | GOOD | GOOD | STEADY | GOOD | GOOD | STEADY |
| INTERRUPTIONS | GOOD | GOOD | STEADY | GOOD | GOOD | STEADY |
| VOLTAGE SAGS | GOOD | GOOD | STEADY | GOOD | GOOD | STEADY |
| VOLTAGE SWELLS | GOOD | GOOD | STEADY | GOOD | GOOD | STEADY |
| TRANSIENT OVERVOLTAGES | N/A | N/A | N/A | N/A | N/A | N/A |
| FLICKER | N/A | N/A | N/A | N/A | N/A | N/A |

POWER QUALITY INDEX READINGS
DEVICE: CIRCUIT MONITOR
TIME: 11:07:47 AM
DATE: 6/3/2003

*Fig. 13*
DISPLAY OF POWER QUALITY INDEX READINGS

METHOD FOR POWER QUALITY SUMMARY AND TRENDING

FIELD OF THE INVENTION

This invention is directed generally to the evaluation of power quality within an industrial, commercial or institutional facility. The invention provides a method for accumulating, summarizing, and trending data pertinent to the evaluation of power quality and involves the monitoring and evaluation of several electromagnetic phenomena.

SUMMARY OF THE INVENTION

The evaluation of power quality within an industrial, commercial or institutional facility is a complicated job requiring specialized equipment, training and experience. Therefore, a method is required for accumulating, summarizing and trending data pertinent to the evaluation of power quality, which can be incorporated in a circuit monitor and/or system of circuit monitors.

One of the aspects a power monitoring methodology is in the configuration of circuit monitoring equipment to collect the appropriate electrical data pertinent to the monitored facility and the load types present in the power distribution system. Thus, depending on the power distribution plant, appropriate phenomena and setpoints for the phenomena are selected for analysis.

Since the analysis of accumulated electrical data is a complex process, it is desirable to be able to present an analysis in an accessible and easy to use manner while preserving the mass of collected data for other complex processing processes. A system of weights, which can be assigned to the various aspects of the collected data, based on the nature of the power distribution plant or facility and the load types therein, aid in the simplification process.

Power quality information is summarized in categories similar to those defined in IEEE Std 1169-1995, IEEE "Recommended Practice for Monitoring Electric Power Quality", Institute of Electrical and Electronics Engineers, and EN50160:2000, "Voltage Characteristics of Electricity Supplied by Public Distribution Systems," European Committee for Electrotechnical Standarization. While these standards deal with almost identical lists of electromagnetic phenomena, their definitions and classifications differ substantially. According to one embodiment of the present invention, with the emphasis on simplicity, the following, non-exhaustive list of power quality summary categories is used herein as an illustrative example:

Under Voltage
Over Voltage
Voltage Imbalance
Waveform Distortion
Frequency Variations
Flicker
Voltage Sags
Voltage Swells
Interruptions
Transient Overvoltages A method to score these evaluations for each category is provided, as well as a method to combine the individual evaluations into an overall Power Quality Index (PQI). Industry standard circuit monitors already support evaluation of power quality as defined in the EN50160 standard. According to one embodiment of the present invention, data is collected as described by the EN50160 standard, and further, alarms are used to collect additional data.

Data is collected to support 4 levels of reporting.
Level 1—Overall Power Quality Evaluation, Summary and Trend
Level 2—All Power Quality Category Evaluations, Summaries and Trends
Level 3—Individual Power Quality Category Evaluation Details
Level 4—Listing of individual alarm events A $5^{th}$ level of detail is provided in the form of waveform captures and other event capture and logging features. At this level, data from multiple Circuit Monitors can be combined to present a system-wide Power Quality Index.

BRIEF DESCRIPTION OF THE DRAWINGS

In the drawings:

FIG. 3 is a table of building types according to one embodiment of the present invention;

FIG. 4 is a table of load types present for various building types, according to one embodiment of the present invention.

FIG. 5 is a table of electrical interruptions weighting based on building type, for different time scales;

FIG. 6 is a table of category weights of electrical phenomena categories for different load types;

FIG. 7 is a table of alarm setpoints for circuit monitoring equipment of electrical phenomena categories for different load types;

FIG. 8 is a table alarm weights for circuit monitoring equipment of electrical phenomena categories for different load types;

FIG. 9 is a table of weights for voltage sag data over different durations for each percentage of nominal voltage;

FIG. 10 is a table of weights for voltage swell data over different durations for each percentage of nominal voltage;

FIG. 11 is a table of weights for transient overvoltage data over different durations for each percentage of nominal voltage;

FIG. 13 is an example of an overall power quality index summary report.

DETAILED DESCRIPTION OF THE ILLUSTRATED EMBODIMENT

Figure 1:
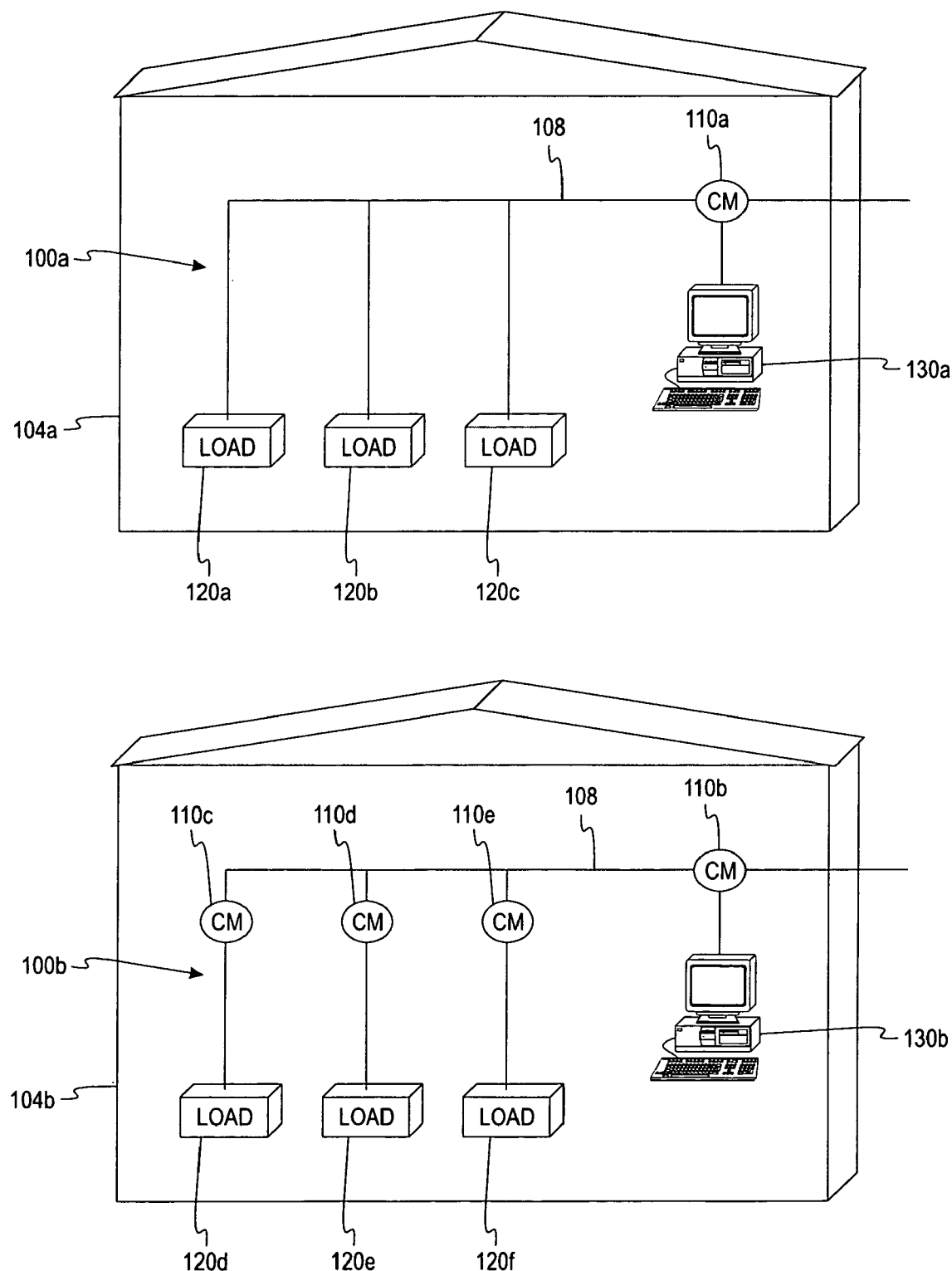
FIG. 1 is a block diagram illustrating generalized environments for power distribution within a building facility.

Referring now to the drawings, and initially to FIG. 1, a block diagram of a power distribution system 100a, according to one embodiment of the present invention is shown. The power distribution system 100a provides power to a facility 104a. Within the facility 104a the power is monitored by a circuit monitor 110a which is optionally networked to a computer system 130a. The electrical power is distributed with the plant 104a to a series of loads 120a–c. The power distribution system 100a thus represents a system with a single central power monitoring device 110a.

Another power distribution system 100b is shown distributing power within a facility 104b, according to another embodiment of the present invention. In this scenario there is a central circuit monitor 110b and branch circuit monitors 120d–e supplying electrical power to loads 120d–f respectively. The circuit monitors are optionally networked together and with a central computer system 130b.

In yet another embodiment of the present invention, the number and placement of circuit monitors within a facility varies, depending on the variety of loads present in the facility and the need to maintain different monitoring configurations based on the loads present. The accumulation of power quality data and analysis of the data is a complex task involving the monitoring and evaluation of several electromagnetic phenomena. Accordingly, a method is provided, according to one embodiment of the present invention to analyze the several factors in a power distribution system, such as the facility or building type and the nature of the loads present within the system, to produce configuration values for the circuit monitors and weighting values for the task of analyzing the electrical power data.

According to one embodiment of the present invention, a method is provided for accumulating, summarizing and trending data pertinent to the evaluation of power quality, which can be incorporated in a circuit monitor and/or system of circuit monitors.

According to another embodiment of the present invention, a monitoring system is provided that includes the determination of values called power quality indices, which allow complex power quality issues to be evaluated and expressed as a single number, which makes power quality data more accessible and easier to use.

According to another embodiment of the present invention, a method is provided to combine the power quality indices from several power quality summary categories into a single overall power quality index (PQI). According another embodiment of the present invention, a method is provided for trending data for the power quality indices so that the user can be alerted when the power quality within the facility changes, and most particularly when the power quality is becoming worse.

According to a further embodiment of the present invention, a method is provided to inform the metering device of its "context" in the power distribution system, to allow appropriate metering configurations and data analyses to be made automatically.

Figure 2:
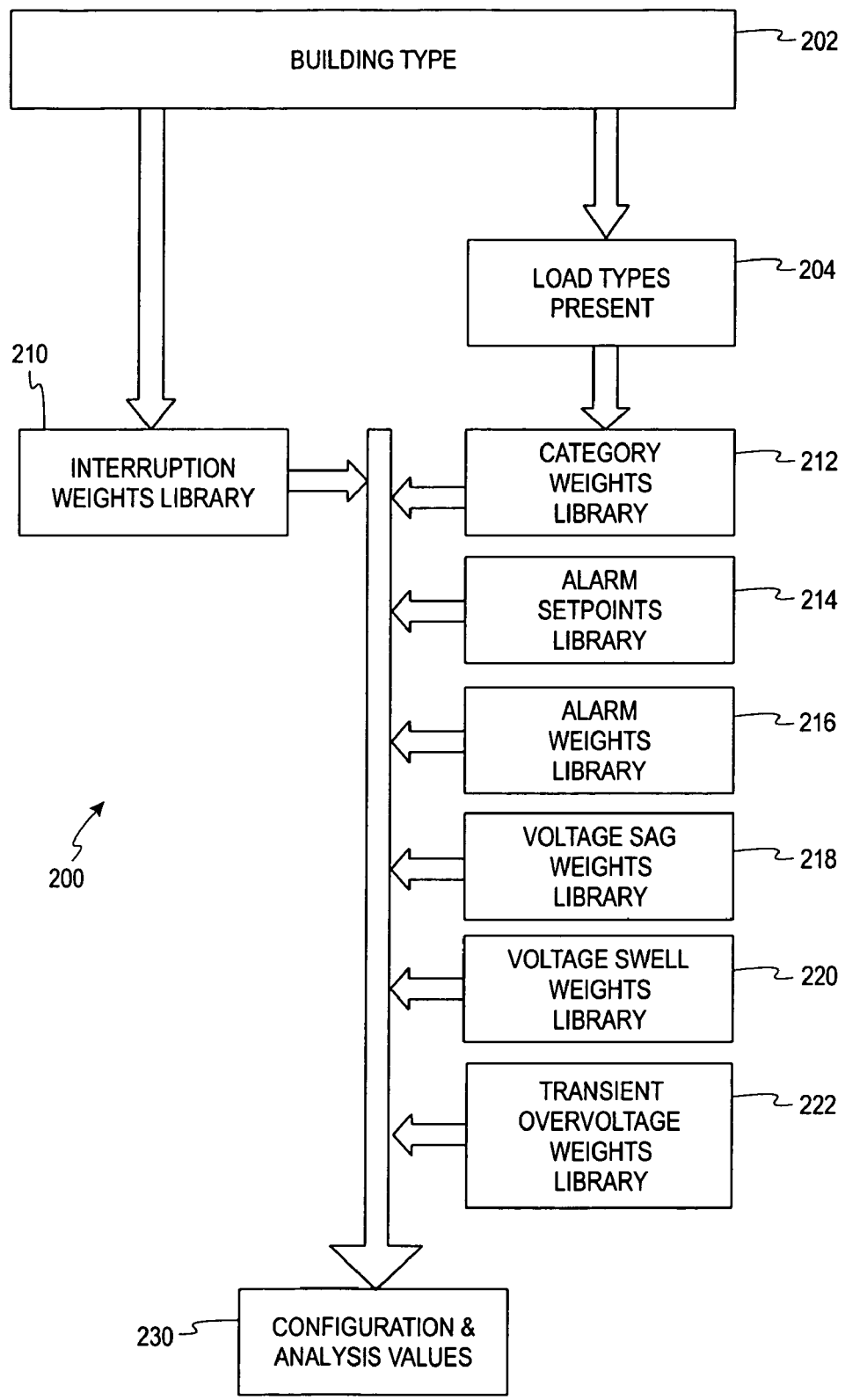
FIG. 2 is a block diagram illustrating the organization of the power quality index libraries accord to one embodiment of the present invention.

Turning now to FIG. 2, a generalized library organization 200 of PQI libraries 210–222, according to one embodiment of the present invention, is shown. The library organization 200 shows the steps required to produce configuration values and analysis weights at node 230 for a power quality monitoring system.

To derive configuration values for the power monitoring and evaluation system, the user indicates, at step 202, the type of building in which the circuit monitor is installed. For each building type, there are library entries of the load types usually present in that type of building. A weighting factor is assigned to each facility type expected to be monitored by an application of the present invention. Other context-related elements are:

Metering location in the power system (main, feeder, branch)
Load type(s)
Load Peak (constant, summer, winter)
Load importance (normal, critical, life safety)
Load characteristics (Motors, Lighting, ASDs, Computer sensitive loads, Generators, Welders/Arc furnaces, Capacitors, transformers, CNC, UPS)

A main metering location is the circuit path which delivers electrical energy from the serving utility to the wiring system of the premises served. A feeder circuit is between the final branch overcurrent device, and service equipment, the source of a separately derived system, or other power supply source. A branch location is between the load(s) and the final overcurrent device protecting the circuit.

A constant load peak does not vary based on time of year. Summer and winter load peaks occur during their respective seasons.

At step 204 the load types present library is queried. For each load type present, a library entry exists, which indicates the reference library entries to use. This is explained further with reference to FIG. 4. The worst case of each individual alarm setpoint or weighting factor is then applied in the circuit monitoring equipment to produce the PQI for each category of loads and the overall PQI. If the circuit monitoring equipment is on a branch circuit, then a single load type is identified by the user.

A normal load importance is for electrically powered equipment whose continuous operation is not necessary to maintain a facility's productive operation. Electrically powered equipment whose continuous operation is necessary to maintain a facility's productive operation is considered of critical importance. Electrically powered equipment whose continuous operation is necessary to maintain occupants' life and safety is considered of life safety importance.

Each load type, e.g., motors or lighting, have an impact on the electrical requirements of a power system and also have an impact on the quality of a power system for example when electrical motors startup or when lighting systems are turned on or off at different times of the day and these characteristics must be taken into account when generating a PQI of the power system.

At step 210, an interruptions weighting library is queried, based on the building type, that contains the number of interruptions for each duration (day, week, month, etc.) that would result in a PQI of zero, if that number of interruptions occurred. A descriptive library of interruption weighting is discussed further with reference to FIG. 5.

At step 212 the category weights library 212 is queried. Each library entry contains the weighting of each of the power quality categories of:
Undervoltage
Overvoltage
Voltage Unbalance
Waveform Distortion
Frequency Deviation
Interruptions
Voltage Sags
Voltage Swells
Flicker
Transient Overvoltages Each power quality category is weighted according to the load types present as further described with reference to FIG. 6. For any given circuit or branch circuit 10 values are obtained.

At step 214 the alarm setpoints library is queried. Each library entry contains the alarm setpoints for each of the alarms used to evaluate the power quality. These values are used to configure the circuit monitor used on the circuit or branch circuit and are based on the type of load present. The alarm setpoint library is further discussed in reference to FIG. 7. Sixteen values are obtained for setting the alarm points of the monitors for a variety of electrical phenomena.

At step 216 the alarm weights library is queried. Each library entry contains the weighting of each circuit monitor alarm on a daily, weekly, and monthly intervals. The alarm weights are used in the analysis process, as described later, for a variety of electrical phenomena. The alarm weights library query results in 48 values obtained. Sixteen values for each time interval required, daily, weekly and monthly.

Thus, the alarm setpoints library provides circuit monitor configuration data and the alarm weighting library provides corollary for the analysis of alarming data.

At step 218 the voltage sags weighting library is queried. Each library entry contains the number of voltage sags for each combination of magnitude and duration that would result in a PQI of 0 if that number of sags occurred on three time scales of a day, week or month. The voltage sags weighting library is described further in reference to FIG. 9. [IS THERE A LIBRARY FOR EACH LOAD TYPE?] A query of the voltage sags weighting library produces 3 tables of 77 values for each time scale, for a total of 231 values. These values are used to determine the PQI based on voltage sag phenomena.

At step 220 the voltage swell weighting library is queried. Each library entry contains the number of voltage swells for each combination of magnitude and duration that would result in a PQI of 0 if that number of swells occurred on three time scales of a day, week or month. The voltage swells weighting library is described further in reference to FIG. 10. A query of the voltage swell weighting library produces a table of 77 values for each time scale, for a total of 231 values. These values are used to determine the PQI based on voltage swell phenomena.

At step 222 the transient overvoltage weighting library is queried. Each library entry contains the number of transient overvoltages for each combination of magnitude and duration that would result in a PQI of 0 if that number of transients occurred in a day, week, or month. The transient overvoltage weighting library is described further with reference to FIG. 11 A query of the transient overvoltage weighting library results in a table of 63 values for each time scale, for a total of 189 values.

The power quality summary categories can be divided into two types of phenomena; 1) steady-state, long duration conditions, and 2) abnormal events. The Power Quality Index for the steady-state conditions is based on the percentage of time the condition exists during the evaluation period and the severity of the condition. The Power Quality Index for the abnormal events is based on the number and severity of the events that occur during the evaluation period.

Under voltage is evaluated based on the amount of time the voltage is below acceptable limits. Standard speed alarms are used to monitor the 3-phase average voltage at 2 levels below the nominal voltage. The levels are selected based on the context of the Circuit Monitor.

The Power Quality Index is based on the amount of time the voltage is below these levels. Each level is assigned a weighting factor which is the number of seconds which would be considered a PQI of 0% (worst power quality), also based on the context of the Circuit Monitor.

$$PQI=1-[(\text{seconds voltage below level 1/weighting factor 1})+(\text{seconds voltage below level 2/weighting factor 2})].$$

The PQI is limited from 0% to 100%. For example, for a facility that has little tolerance for voltages below 90% of nominal:

level 1 voltage=95% of nominal
level 2 voltage=90% of nominal
weighting factor 1=3600
weighting factor 2=10
if voltage is below 90% for 2 seconds:

$$PQI=1-[(2/3600)+(2/10)]=0.799 \text{ or, } 79.9\%$$

if voltage is below 90% for 5 seconds:

$$PQI=1-[(5/3600)+(5/10)]=0.499 \text{ or, } 49.9\%$$

Over voltage is evaluated the same way as under voltage except the alarm setpoints are above the nominal voltage.

Voltage imbalance is evaluated the same way as under voltage except the alarm setpoints are based on the worst voltage unbalance.

Waveform distortion is evaluated in the same way as under voltage except the alarm setpoints are based on the total harmonic distortion and the worst individual harmonic component.

Frequency variations are evaluated the same way as under voltage except the category includes over frequency and under frequency.

Flicker is evaluated the same way as undervoltage except the alarms are based on the scaled values of Pst. Pst is the "Short Term Flicker" based on IEC Standard 61000-4-15.

Voltage sags are detected and classified for each phase voltage. For the Power Quality Summary, each cell in the table shown in FIG. 9, according to one embodiment of the present invention, is assigned a weight from 0–100 for the daily, weekly, and monthly intervals. The PQI for Voltage Sags is calculated as:

$$1-\Sigma(\text{count in each cell for interval for all 3 phases/weight of each cell for interval})$$

The PQI is limited from 0% to 100%. So, if a cell has a weight of 1% and a single event occurs in that cell, then the PQI for Voltage Sags would be 0%. Any additional voltage sag events would not affect the PQI. If a 3-phase voltage sag occurs in a cell with a weight of 100, the PQI would be 97%.

The weighting factors are assigned based on the context of the Circuit Monitor as described above.

Voltage swells are detected and classified for each phase voltage. The PQI for voltage swells is calculated the same way as the voltage sags. A table shown in FIG. 10 shows a layout of phase calculations for each phase voltage according to one embodiment of the present invention.

Interruptions are detected and classified for each phase voltage and for 3-phase events as shown by the table in FIG. 5. The PQI for interruptions is calculated the same way as voltage sags.

Transient overvoltages are detected and classified for each phase voltage as shown by the table in FIG. 11. The PQI for transient overvoltages is calculated the same way as voltage sags above.

The overall PQI can be calculated in two ways. The user can select one of the following methods for calculating the overall PQI.

1) Weighted Average: PQI is made up of the weighted combination of these 10 categories. According to one embodiment of the present invention the overall PQI is calculated as the sum of the actual category power quality indices/the sum of the category weighting factors. The value is expressed as an integer percent 0–100 with 0 being the worst.

Each category is evaluated and assigned a category PQI from 0–100% with 100% being the best. This value is multiplied by the weighting factor for that category. The weighting factor is a value from 0–10.

(2) Worst Individual PQI: Overall PQI is equal to the lowest individual PQI.

Figure 12:
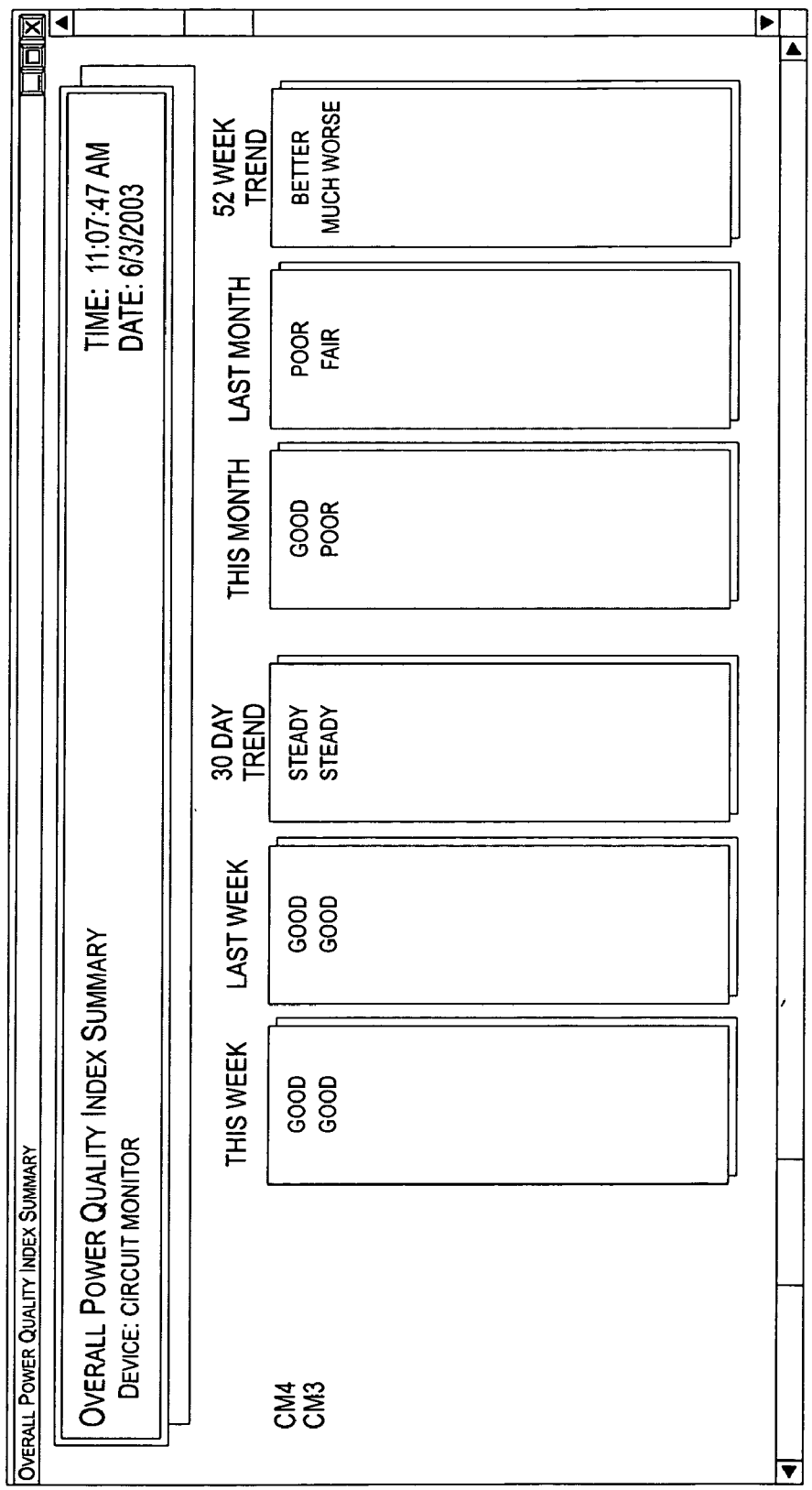
FIG. 12 is an example of a power quality index reading report.

Referring now to FIG. 12, a table, according to one embodiment of the present invention, provides power quality summary and trend data for each of the power quality categories.

Thus, for each category, e.g. under voltage, the above formats, slope, intercept, etc. are maintained on a daily, weekly and monthly basis and is made available to system management software.

Each power quality summary category is assigned a weighting factor. According to one embodiment of the present invention, the weighting factor is an integer 0–10, with 10 being the most important. The weighting factors are used in calculating the power quality indices as described above. Default weighting factors are applied, based on the circuit monitor context.

FIG. 3 is a table of building types, according to one embodiment of the present invention. The list is not meant to be exhaustive, but represents a majority of building types having different electrical loads and electrical power requirements. For a generalized methodology, according to one embodiment of the present invention, electrical power characteristics are assigned to each building type as will be apparent in the further description of electrical phenomena to be collected and analyzed.

FIG. 4 is an excerpt of a library table of load types for each building type considered, according to one embodiment of the present invention. Not all of the building types of FIG. 3 are represented here. For each building type represented in the library, various loads are shown to be present (1) or absent (0).

FIG. 5 is an excerpt of a library table of weights for electrical interruptions, according to one embodiment of the present invention. The table is an example and not all of the building types of FIG. 3 are represented here. For each building type represented in the library table of interruption weights, the number of interruptions that would result in a PQI of zero, for three time scales is shown. Thus, for a control tower, a sensitive building type, a single interruption during any time scale would yield a PQI of zero. On the other hand, for an amusement ride, a single interruption on a daily basis yields a PQI of zero but on a monthly basis, 3 interruptions are required to reduce the PQI to zero.

FIG. 6 is a category weights library table according to one embodiment of the present invention. In the category weights library, for each load type represented an overall PQI value is shown for each category of electrical phenomena. From this it is shown that for an AC motor, and undervoltage condition with a weight of 10 is considered to be very important. For the same AC motor however, a flicker condition with a weight of 2 is considered to be relatively unimportant. The use of the weights when computing an overall weighted average PQI score was described above.

FIG. 7 is an alarm setpoint library table according to one embodiment of the present invention. In the alarm setpoint library, for each load type represented, a percentage, in hundredths, of each category of electrical phenomena is provided to determine an alarm setpoint. The percentage figures shown are for specific load types.

FIG. 8 is an alarm weights library table according to one embodiment of the present invention. In the alarm weights library, for each load type represented, a number of seconds for each category of electrical phenomena is provided to determine the PQI. For example, for any given monitoring time period, say daily, if an induction motor experienced a condition of undervoltage level 1 for a total of 240 seconds the daily PQI would be zero. Similarly, if the same induction motor experienced an overvoltage level 2 condition for only 120 cumulative seconds in a day the PQI would also be zero. The overvoltage level 2 condition is more severe than the undervoltage level 1 condition. Note that different threshold levels are set for many of the observable conditions.

FIG. 9 is an excerpt of a library table of voltage sag weights according to one embodiment of the present invention. The weights are provided for different durations in seconds over a variety of voltage sag phenomena. The voltage sags are listed as a depth, which is a percentage of the nominal voltage value. The "ok" value provided in some cells is a very large number of sags that can occur without incurring a weight penalty. Thus, a sag depth within 10–20% of the nominal voltage over very short time intervals, incurs no weight penalty. FIG. 9 represents only one library category, for example, referring back to FIG. 8 only one row or one alarm weighting library is covered. There would be a voltage sag weighting library entry for each category of load types present.

FIG. 10 an excerpt of a library table of voltage swell weights according to one embodiment of the present invention. The weights are provided for different durations in seconds over a variety of voltage swell phenomena. The voltage swells are listed as a magnitude of the percentage of the nominal voltage value. The "ok" value provided in some cells is a very large number of swells that can occur without incurring a weight penalty. Thus, a swell magnitude within 110–120% of the nominal voltage over very short time intervals, incurs no weight penalty. FIG. 10 represents only one library category, for example, referring back to FIG. 8 only one row or one alarm weighting library is covered. There would be a voltage swell weighting library entry for each category of load types present.

FIG. 11 an excerpt of a library table of transient overvoltage weights according to one embodiment of the present invention. The weights are provided for different durations in microseconds over a variety of overvoltage phenomena. The overvoltages are listed as a magnitude of the percentage of the nominal voltage value. FIG. 11 represents only one library category, for example, referring back to FIG. 8 only one row or one alarm weighting library is covered. There would be a transient overvoltage weighting library entry for each category of load types present.

FIG. 12 is an example of a power quality index report according to one embodiment of the present invention. The example data shown is for illustrative purposes but is consistent with the methodologies discussed above. The PQI summary and trend analysis is translated into the indicated English phrases to provide a readable user interface.

FIG. 13 is an example of a power quality index summary report according to one embodiment of the present invention. The example data shown is for illustrative purposes but is consistent with the methodologies discussed above. The PQI summary and trend analysis is translated into the indicated English phrases to provide a readable user interface.

While particular embodiments and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

What is claimed is:

1. A system for accumulating and evaluating electromagnetic phenomena of multiple power quality categories of a power distribution system, comprising a circuit monitor coupled to said power distribution system and accumulating data representing said electromagnetic phenomena, said circuit monitor being programmed to determine a power quality index for each of said multiple power quality categories, and a single overall power quality index for all of said power quality categories, said power quality indices for power quality categories involving steady state conditions being based on the percentage of time said conditions exist during an evaluation period and the severity of such conditions, and said power quality indices for power quality categories involving abnormal events being based on the number of such events that occur during an evaluation period and the severity of such events.

2. The system of claim 1 wherein said single overall power quality index for all of said power quality categories is the lowest of said power quality indices for said power quality categories.

3. The system of claim 1 wherein said power quality indices for power quality categories are based at least in part on data collected from networked circuit monitors.

4. The system of claim 3 wherein said networked circuit monitors include branch circuit monitors.

5. A system for accumulating and evaluating electromagnetic phenomena of multiple power quality categories of a power distribution system, comprising a circuit monitor coupled to said power distribution system and accumulating data representing said electromagnetic phenomena, said circuit monitor being programmed to determine a power quality index for each of said multiple power quality categories, and a single overall power quality index for all of said power quality categories that is a weighted average of said power quality indices for said power quality categories, said weighted average being based on the nature of the power distribution facility and the load types in said facility.

6. The system of claim 5 wherein said weighted average is based on the nature of the power distribution facility and the load types in said facility.

7. The system of claim 5 wherein said single overall power quality index for all of said power quality categories is the lowest of said power quality indices for said power quality categories.

8. The system of claim 5 wherein said power quality indices for power quality categories are based at least in part on data collected from networked circuit monitors that include branch circuit monitors.

9. A method of accumulating and evaluating data representing electromagnetic phenomena of multiple power quality categories of a power distribution system, comprising
    determining an individual power quality index for each of said multiple power quality categories, and
    determining an overall power quality index for all of said individual power quality indices, weighting said at least one power quality category according to the load type present, said power quality indices for power quality categories involving steady state conditions being based on the percentage of time said conditions exist during an evaluation period and the severity of such conditions, and said power quality indices for power quality categories involving abnormal events being based on the number of such events that occur during an evaluation period and the severity of such events.

10. The method of claim 9 wherein said single overall power quality index for all of said power quality categories is the lowest of said power quality indices for said power quality categories.

11. The method of claim 9 wherein said power quality indices for power quality categories are based at least in part on data collected from networked circuit monitors.

12. The method of claim 9 wherein said power distribution system comprises a system of networked circuit monitors, wherein each of said circuit monitors accumulates data representing said electromagnetic phenomena, and is programmed to determine said power quality index for each of said multiple power quality categories, and said single overall power quality index for all of said power quality categories.

13. A method of accumulating and evaluating data representing electromagnetic phenomena of multiple power quality categories of a power distribution system, comprising
    determining an individual power quality index for each of said multiple power quality categories, and
    determining an overall power quality index for all of said individual power quality indices weighting said at least one power quality category according to the load type present that is a weighted average of said power quality indices for said power quality categories, said weighted average being based on the nature of the power distribution facility and the load types in said facility.

14. The method of claim 13 wherein said weighted average is based on the nature of the power distribution facility and the load types in said facility.

15. The method of claim 13 wherein said single overall power quality index for all of said power quality categories is the lowest of said power quality indices for said power quality categories.

16. The system of claim 13 wherein said power quality indices for power quality categories are based at least in part on data collected from networked circuit monitors that include branch circuit monitors.

\* \* \* \* \*